United States Patent [19]
Clement et al.

[11] 3,958,129
[45] May 18, 1976

[54] AUTOMATIC CRYSTAL DIAMETER CONTROL FOR GROWTH OF SEMICONDUCTOR CRYSTALS

[75] Inventors: Donald R. Clement; Carl A. Helber, both of Scottsdale; Lawrence D. Mason, Phoenix, all of Ariz.

[73] Assignee: Motorola, Inc., Chicago, Ill.

[22] Filed: Aug. 5, 1974

[21] Appl. No.: 494,438

[52] U.S. Cl. .................................. 250/577; 250/574; 23/301 SP; 23/273 SP
[51] Int. Cl.² .......................................... G01N 21/26
[58] Field of Search ............ 250/215, 221, 222, 574, 250/577, 209; 356/159, 160; 23/301 SP, 273 SP

[56] References Cited
UNITED STATES PATENTS

| | | | |
|---|---|---|---|
| 3,493,770 | 2/1970 | Dessauer et al. | 250/206 X |
| 3,574,650 | 4/1971 | House | 250/216 X |
| 3,740,563 | 6/1973 | Reichard | 250/577 X |
| 3,805,061 | 4/1974 | DeMissimy et al. | 250/209 |
| 3,882,319 | 5/1975 | Clement et al. | 250/577 |

*Primary Examiner*—Walter Stolwein
*Attorney, Agent, or Firm*—Henry T. Olsen; Harry M. Weiss

[57] ABSTRACT

Apparatus for automatically controlling, by stationary optical means, the diameter of a crystal from seed to final taper in a Czochralski crystal pulling method is disclosed. The diameter control has a feed back loop including diameter sensing means which controls a motor for moving the pulled crystal up faster or slower. The diameter, at any value, is sensed by two closely adjacent photocells receiving radiation from spaced points on the solid-liquid interface and a voltage value corresponding to that diameter is developed.

When a constant diameter is being maintained and the diameter increases, the magnitudes of the sensed radiation change and a difference signal voltage in one direction is generated causing the crystal pull rate to increase. When the diameter decreases the magnitudes of the sensed radiation change in the reverse and a difference signal voltage in the opposite direction is generated causing crystal pull rate to decrease.

For causing the crystal to grow in diameter as desired an offset voltage according to a predetermined program is balanced against the photocell voltage error voltage of one pair of photocells and the resultant difference signal is used to control the pull speed so as to change the diameter accordingly. When the diameter has changed, for example, increased to a point where the liquid-solid interface has changed location sufficiently, the next set of photocells takes over to develop an error voltage. A further diameter related offset voltage is developed and balanced against the error voltage and the crystal is forced to continue to increase in diameter accordingly. The process continues until final diameter is reached.

5 Claims, 11 Drawing Figures

THIS CURVE IS TYPICAL FOR PHOTO CELL AS CRYSTAL GROWS

AUTOMATIC CRYSTAL DIAMETER CONTROL FOR GROWTH OF SEMICONDUCTOR CRYSTALS

RELATED APPLICATIONS

This application related to application Ser. No: 408,897, now U.S. Pat. No. 3,882,319, of the same inventors, entitled AUTOMATIC MELT LEVEL CONTROL FOR GROWTH OF SEMICONDUCTOR CRYSTALS and assigned to the same assignee as the subject invention.

BACKGROUND OF THE INVENTION

This invention relates to apparatus for growing semiconductor crystals, such as, for example, silicon or germmanium crystals, by the Czochralski method, more particularly to apparatus for automatically controlling the diameter of such a crystal at all diameter values from seed to final taper while the crystal is being pulled, and it is an object of the invention to provide improved apparatus of this nature.

The Czochralski method of crystal growing is well known and various schemes are available in the prior art for controlling the diameter of the crystal to a single value during the crystal pulling, or growing, process. While such diameter control schemes have been of the closed loop variety, it has not been known to use a stationary optical system which encompasses, optically, the whole range of crystal diameters from seed to final taper and to automatically control the diameter at all values including the final value according to predetermined settings of these parameters. Accordingly it is a further object of the invention to provide an improved system for crystal diameter control of the nature indicated.

It is a further object of the invention to provide an improved crystal diameter control of the character indicated which is simple in form, accurate in operation and achieves higher quality crystals, for example, crystals having better thermal stability and more consistent and repeatable crystal diameter.

SUMMARY OF THE INVENTION

In carrying out the invention in one form, there is provided in a system for automatically growing a crystal of controlled diameter from a seed, through neck-in, shoulder, body and final taper from a melt of material including a container for said melt, motor means for pulling a crystal from said melt; means for controlling said motor means; and means responsive to radiation existing at the liquid-solid interface of said crystal as it is being pulled for controlling said motor control means comprising, radiation sensitive means positioned to receive radiation from said liquid-solid interface throughout the total region from seed to final taper and having means associated with each of said regions responsive to the radiation from said each of said regions; programmed means for automatically selecting the radiation sensitive means associated with said each of said regions through the cycle of crystal growth from seed to final taper; and means for applying a signal from said selected radiation sensitive means to said motor control means which comprises lens means and a series of cells for receiving the radiation transmitted by said lens means.

In carrying out the invention according to a further form, there is provided in a system for automatically growing a crystal of controlled diameter from a seed, through neckin, shoulder, body and final taper from a melt of material including a container for said melt; motor means for pulling a crystal from said melt; means for controlling said motor means; and means responsive to radiation emanating from the liquid-solid interface of said crystal including the halo as said, crystal is being pulled for controlling said motor control means comprising, photosensitive means positioned to receive radiation from said liquid-solid interface throughout the total ragion from seed to final taper; said photosensitive means comprising a series of successively disposed photocells each one of which is arranged to receive radiant energy from a specific area of said liquid-solid interface including said halo between regions of seed and final taper, each photocell of said series being differentially connected to a second photocell spaced by at least one intervening photocell and defining a pair of photocells for developing an error signal whose magnitude varies linearly with changes in crystal diameter over a specified range of crystal diameters and having a null value at a particular value of crystal diameter, the signal from each successive pair of said photocells having a null value at a particular value of crystal diameter greater than the preceding crystal diameter by the same predetermined amount, the linear error signal region of each pair of said photocells extending to the linear error signal region of the next succeeding pair of photocells, programmed means for automatically selecting in sequence the successive pairs of said photocells throughout the cycle of crystal growth from seed to final taper; means for developing a crystal diameter related offset signal and means for combining said offset signal and error signal and supplying same to said motor control means for controlling said motor to pull said crystal to a predetermined diameter.

BRIEF DESCRIPTION OF THE DRAWINGS

For more complete understanding of the invention reference should be had to the drawings in which.

DESCRIPTION OF THE PREFERRED EMBODIMENT

Figure 1:
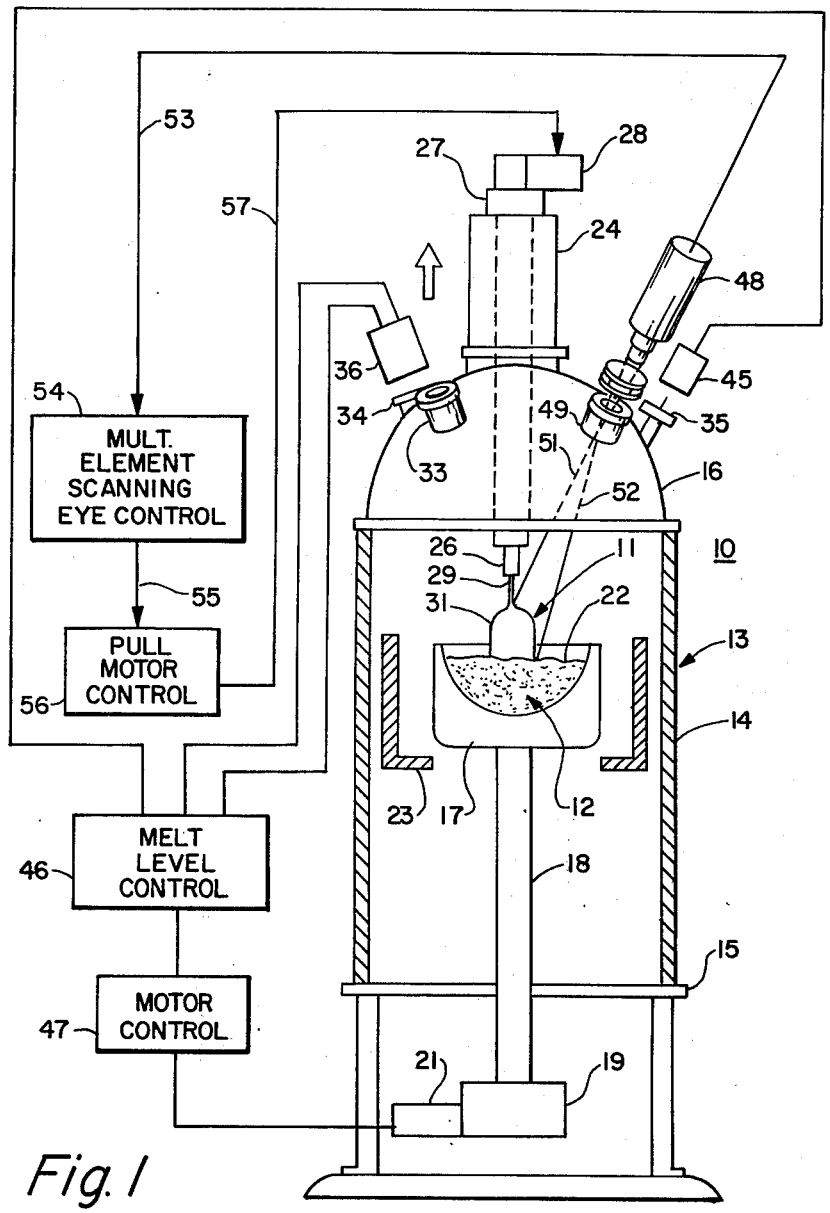
FIG. 1 is a somewhat diagrammatic representation, partially in section, of apparatus and system embodying the invention.
Figure 2:
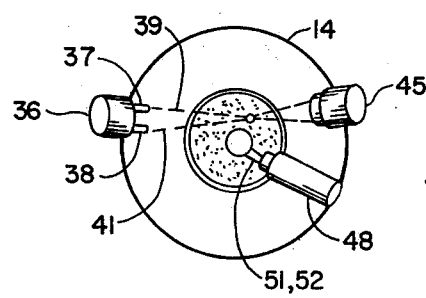
FIG. 2 is a top view of the apparatus shown in FIG. 1.

Referring to the drawings there is shown apparatus 10 for pulling a crystal 11 from a melt 12. For example, the crystal may be silicon, germanium or other.

The apparatus 10 may comprise a more or less cylindrical chamber 13 of useful form and construction including a main body portion 14, a base 15 and a covering dome 16. The interior of the chamber 13 may be filled with any desired atmosphere. Interiorally of the chamber 13 there is a crucible 17 made of quartz, for example, supported on a shaft 18 which projects through the base 15 and is connected to a gear box 19. The gear box is associated with a drive motor 21 whereby the crucible 17, through the shaft 18, is rotated and the height of the crucible 17 may be raised or lowered so as to maintain the surface 22 of the melt constant throughout the crystal pulling operation as will be more fully explained.

Surrounding the crucible 17 is a heater 23 which conveniently may be electrical and of any well known form. Atop the dome 16 there is a shaft guide member 24 through which projects the shaft 25 for supporting the seed crystal 26. The shaft 25 is attached to a gear box 27 which is associated with a seed pull motor 28. The motor 28, through the gear box 27, acts to lift or pull the shaft 25 whereby the seed crystal 26 is pulled away from the surface 22 of melt 12 and, in so doing, forms a neckin portion 29, a shoulder 31, a crystal 11 at its final diameter 30, and ultimately the final taper 32 as the crucible becomes empty.

Also associated with the dome 16 is an observation window 33.

Directly opposite each other but displaced laterally from a diametrical line are two windows 34 and 35 through which infrared radiation is transmitted and received respectively. Infrared radiation is generated in the transmitter or source 36 which comprises two infrared sources 37 and 38 from which infrared radiation beams 39 and 41 are transmitted and aimed at a spot 42 on the surface 22 of the melt 12. Radiation beams 43 and 44 are reflected, respectively, from beams 39 and 41 and are transmitted through window 35 to the sensor, or receiver 45.

The transmitter 36, the receiver 45, the melt level control 46, the motor control 47 and their associated circuitry function to maintain the level 22 constant as is disclosed in the corresponding application Ser. No: 408,897 identified above.

For automatic crystal growth control there is provided a multi-cell photo detector 48 which views the total region of crystal growth through window 49 as visualize by the two rays 51 and 52 spanning the region from neckin 29 to the final diameter 30 of the crystal. The photo detector 48 supplies its signal over conductor 53 to a multiple element scanning eye control 54 which supplies a control signal over conductor 55 to the pull motor control 56 which in turn supplies the pull signal over conductor 57 to the pull motor 28. By appropriate signals as well subsequently become clear, the operation of the motor 28 as controlled by the pull motor control 56 functions to withdraw the crystal from the melt at the appropriate speed to give the precise shape desired by the present control of the apparatus. The diameter of the crystal is controlled by the error signal mechanism at each stage of the diameter. That is to say the diameter is controlled during the neckin portion 28, during the shoulder portion 31, during the final diameter 30 and during the final paper 32. In this manner uniform and high quality crystals can be consistently pulled.

Figure 4A:
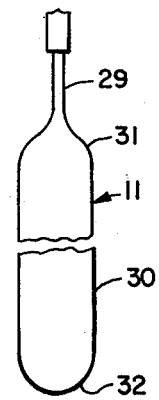
FIG. 4A is an elevational view representing a fully drawn crystal.
Figure 4:
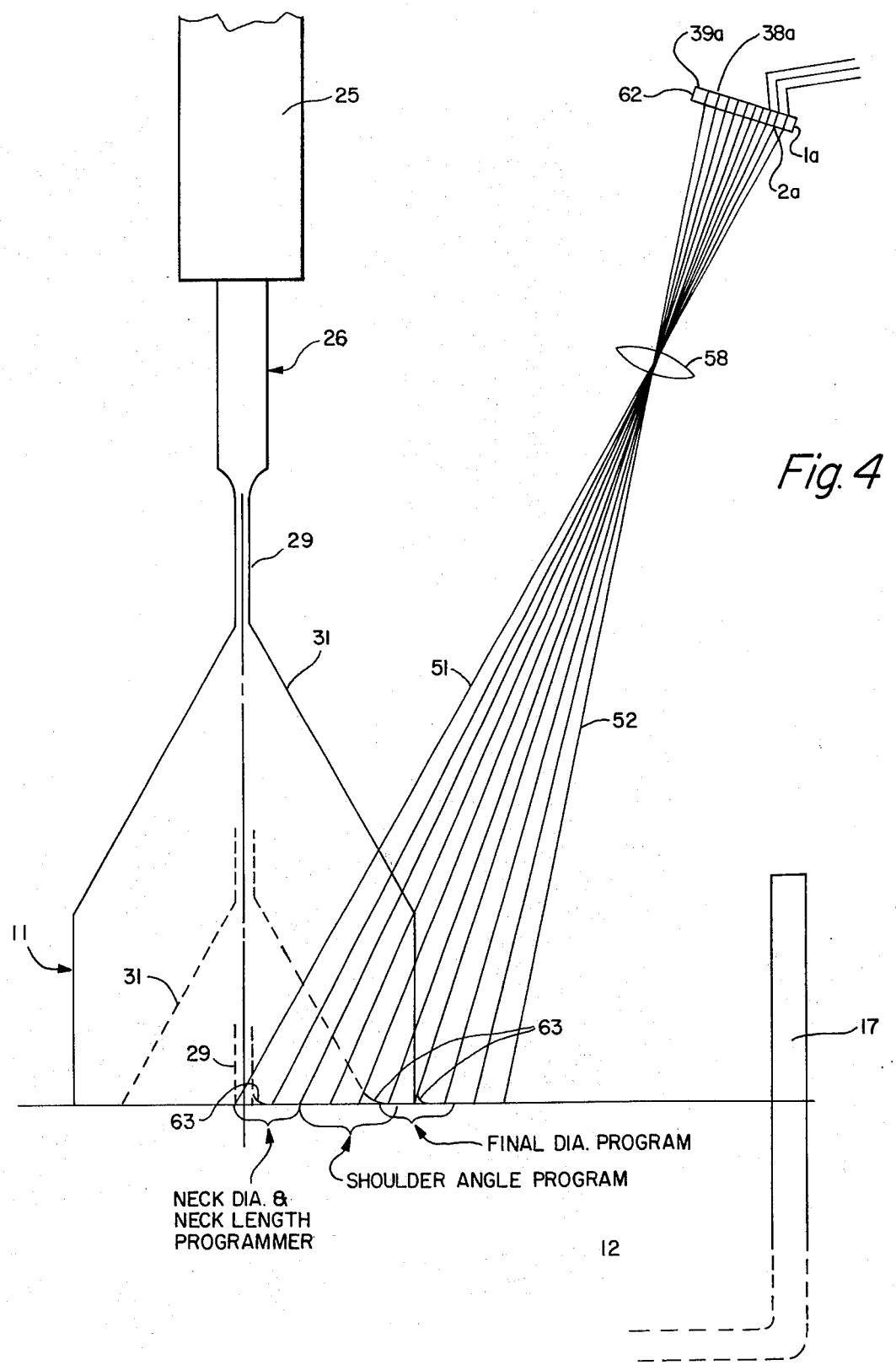
FIG. 4 is a diagrammatic view similar to FIG. 3 but on a larger scale.
Figures 3, 5A, 5B:
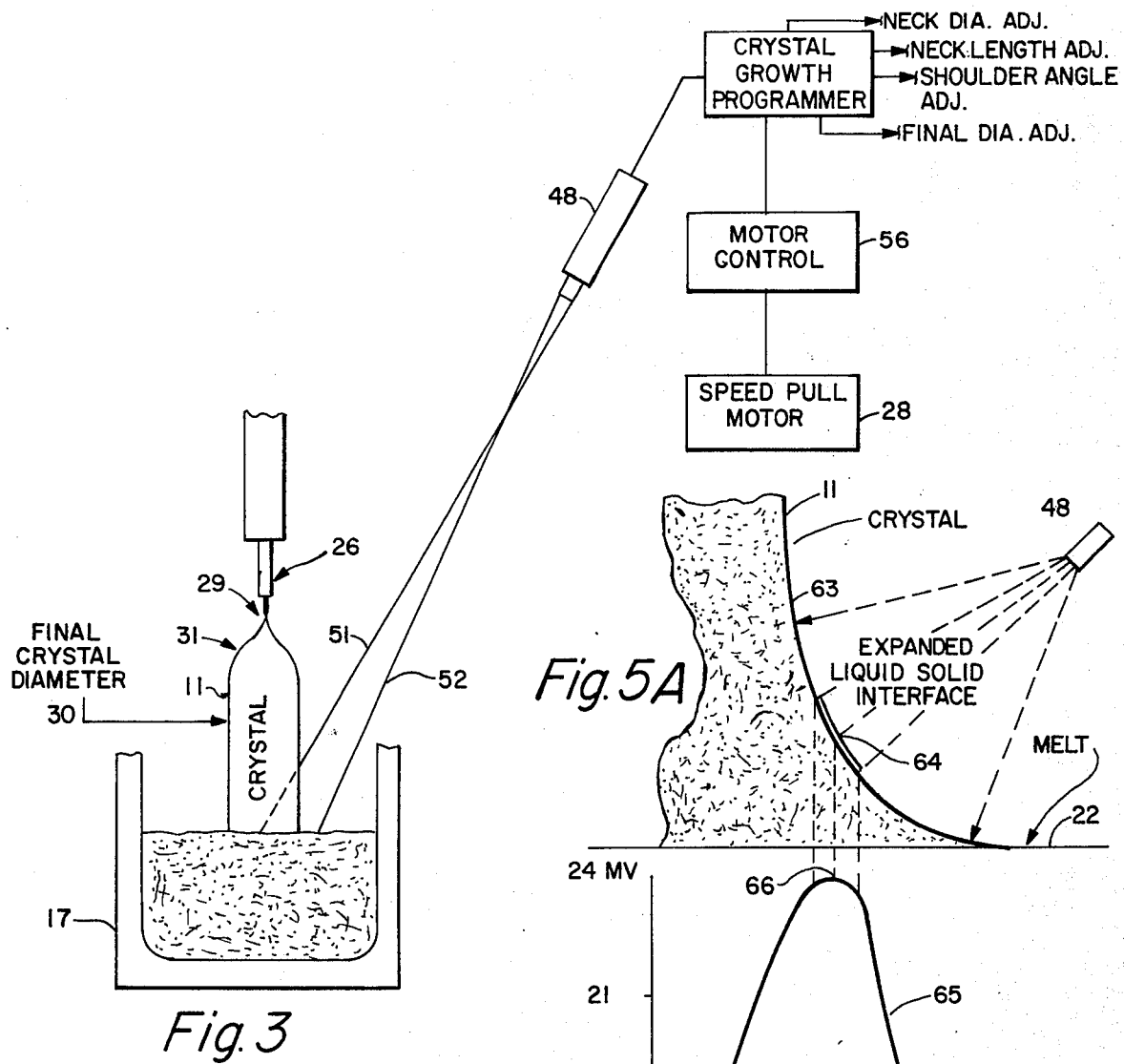
FIG. 3 is a diagrammatic view on a larger scale of a portion of the structure shown in FIG. 1.
FIG. 5A is a diagrammatic view on an expanded liquid solid interface during crystal growth.
FIG. 5B is a graph illustrating the variation of radiation emanating from the expanded liquid-solid interface including the melt surface and the solid crystal.

These excellent results are achieved by having a stationary optical system as may be viewed from a consideration of FIGS. 1, 3 and 4 from which it appears that with a single lens system represented by the reference character 58, the image of the liquid-solid interface at the region of crystal growth from zero diameter (neckin) to final diameter 30 may be projected upon a multi-cell photo detector 62.

In one practical example, the multi-cell detector 62 comprised an array of closely adjacent 39 photo sensor cells each approximately 5 mils square. These dimensions are exemplary only. Thus 39 of the photocells form a small rectangle whose length is about two-tenths of an inch. Through the lens system exemplified by 58, the multi-cell photo detector 62 is projected to cover a crystal diameter from 0 to 3 ½ inches in diameter without moving the sensing head in any way.

When a crystal is being pulled, as is well understood in the art, a seed crystal 26 of the desired crystallographic orientation is dipped into the melt 12 and is withdrawn at a predetermined rate. The first rate of withdrawal of the seed 26 is fairly high resulting in the neckin portion 29 which is of smaller diameter than the seed itself. After a predetermined length of neckin portion has been formed, the rate of withdrawal is decreased uniformly for a predetermined period thereby permitting the crystal to grow the shoulder 31 at an increasing diameter until the final crystal diameter 30 is arrived at. At each stage of withdrawal there is a liquid-solid interface or meniscus 63 as is shown in FIG. 5A. In this figure the meniscus is shown very much expanded, extending from the diameter of the crystal 11 to the surface 22 of the melt. The meniscus 63, of course, exists at each stage of crystal withdrawal as may be seen in FIG. 4.

In FIG. 5A the fragmentary portion of the crystal 11 is shown stippled for better representation. On the surface of the meniscus 63, somewhere between the crystal surface and the melt surface, there appears a halo 64 as is well understood in the art, the halo representing the region of maximum radiation as the melt material solidifies into the solid crystal. Radiation however eminates from the full extent of the meniscus and is detectable by the detector 62. In FIG. 5B there is shown a graph 65 representing the magnitude of the emitted radiation plotted against a horizontal distance representing, somewhat arbitrarily, the extend from the surface of the melt where the radiation is very low to some point of the final diameter of the crystal surface after solidification has occured and where the radiation again is very low. The horizontal scale of the graph in FIG. 5B is not an actual dimension along the surface of the melt but represents distances moved by a sensing device in measuring the radiation from one low value to another representing the full extent from the liquid melt to the solidified and relatively cool crystal surface. The peak 66 of the graph 65 appears more or less at the center of the halo 64 which has a width from one side to the other in practical cases observed of about one-eighth to one-tenth of an inch. The halo 64, it will be understood, is, of course, a ring of bright light surrounding the crystal. The radiation readings plotted as ordinates for graph 65 are shown as millivolts (MV) but any other unit could be used.

Figure 8:
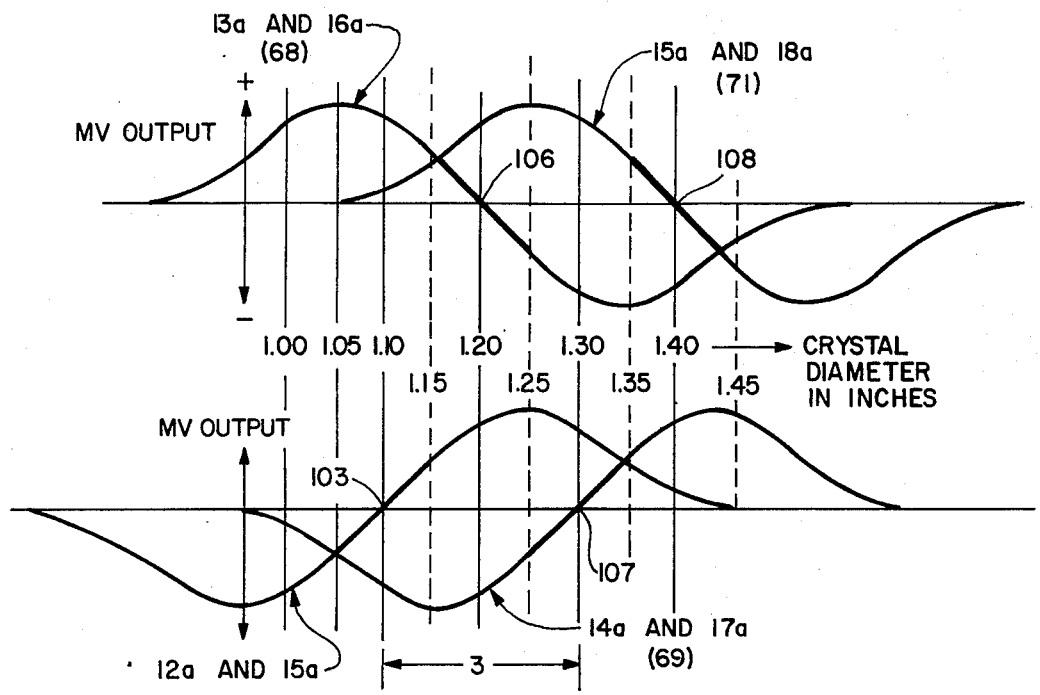
FIG. 8 is a series of graphs illustrating the response of the radiation detecting mechanism according to the invention.

The location of the halo 64 on the surface of the meniscus 63 may be taken as representing the final diameter of the crystal 11. Thus, changes in the location of the halo 64, as the diameter of the crystal changes with the concomitant change in location of the peak 66 of the radiation graph 65, may be used to control the diameter of the crystal as it is being pulled at each stage of its withdrawal. As the halo moves, the location of the photocells of the sensor 62 being stationary, less peak radiation, of course, is received by any one cell as may be discerned by observing graph 65. The difference in radiation may be utilized to develop an error signal for controlling the crystal diameter, as is well understood. Accordingly to the subject invention two sensors are used at all points of crystal diameter and the radiation from the halo 64 and the meniscus on each side thereof are used to develop the error signals as shown in FIG. 8.

Figure 9:
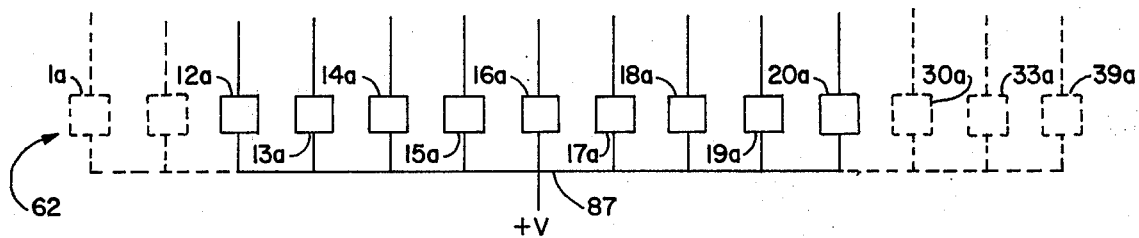
FIG. 9 is a diagram illustrating one aspect of the operation of the sensing mechanism.

Referring to FIG. 9, the individual photocells (diodes) of the multi-cell photo detector 62 are shown side by side as individual units numbered respectively from 1a to 39a inclusive. Any number of cells, depending on the particular application needed, may of course be used. As already pointed out two photocells are used at each value of a crystal diameter to develop the error voltage at that diameter value. Consecutively numbered photocells of course lie adjacent each other as may be seen in FIGS. 4 and 9. According to one form of the invention, individual photocells separated by three numbers are used to develop the error signal for each diameter value. Thus the output voltages of cells 12a and 15a are combined to give graph 67, the output voltages of photocells 13a and 16a are combined to give graph 68 the outputs of photocells of 14a and 17a are combined to give the graph 69, and the outputs of photocells 15a and 18a are combined to give the graph 71 (FIG. 8). Correspondingly the outputs of other pairs of photocell diodes are combined to develop the error signals for controlling the crystal diameter, the pairs of photocells being separated by three numbers, until the final diameter is reached. The diameter is controlled by a feed back loop system.

At the final diameter, whatever it may be, the two photocells determining it may be for example 30a and 33a (FIG. 9).

The width of the halo 64 has been indicated to be about one-tenth to one-eighth of an inch and the individual photo-diode cells, according to the invention, covers an extent of about 0.05 of an inch at the surface of the halo. Thus each diode receives the radiation from about one third to one half of the halo radiation. With the photo-diodes so spaced and arranged the difference of the photo-diode outputs or voltages as occasioned by the radiation thereby result in the graphs 67, 68, 69 and 71 as described. Taking graph 68 (photocells 13a and 16a ), for example, it will be observed that the graph has a positive peak and a negative peak at 1.05 and 1.35 inches of the crystal diameter, passes through zero at 1.20 inches of crystal diameter and has a substantially linear portion extending from 1.15 and 1.25 inches of crystal diameter. Thus graph 68 can be used to to control the crystal diameter at 1.20 inches and can be used to control the diameter from between 1.15 to 1.25 inches, that is to say for a diametrical change of one-tenth of an inch. Similarly the graph 67 passes through zero at the crystal diameter of 1.10 inches, has a linear portion on each side thereof extending from 1.05 to 1.15 inches of crystal diameter and can be utilized to control the crystal diameter between 1.05 and 1.15 inches of crystal diameter, specifically at 1.10 inches; graph 69 passes through zero at 1.30 inches of crystal diameter, has a linear portion on each side thereof extending from 1.25 and 1.35 inches of crystal diameter and can be utilized to control the crystal diameter between 1.25 and 1.35 and specifically at 1.30 inches, if that is the final crystal diameter desired; and graph 71 passes through zero at a crystal diameter of 1.40 inches, has a linear portion on each side thereof extending from 1.35 inches to 1.45 inches of crystal diameter and can be used to control the final diameter of the crystal at 1.40 inches or to control the diameter in variations from 1.35 to 1.45 inches of crystal diameter.

The graphs 67, 68, 69 and 71 are plots of millivolts output representing the radiation voltages of two photodiodes against changes in the crystal diameter.

Observing the graphs of FIG. 8, it will be noted that by using the successive groups of photocells three numbers apart a continuous series of straight line portions, rising and falling, are available to control the crystal diameter from zero diameter to whatever value of diameter is desired.

Figures 6, 7:
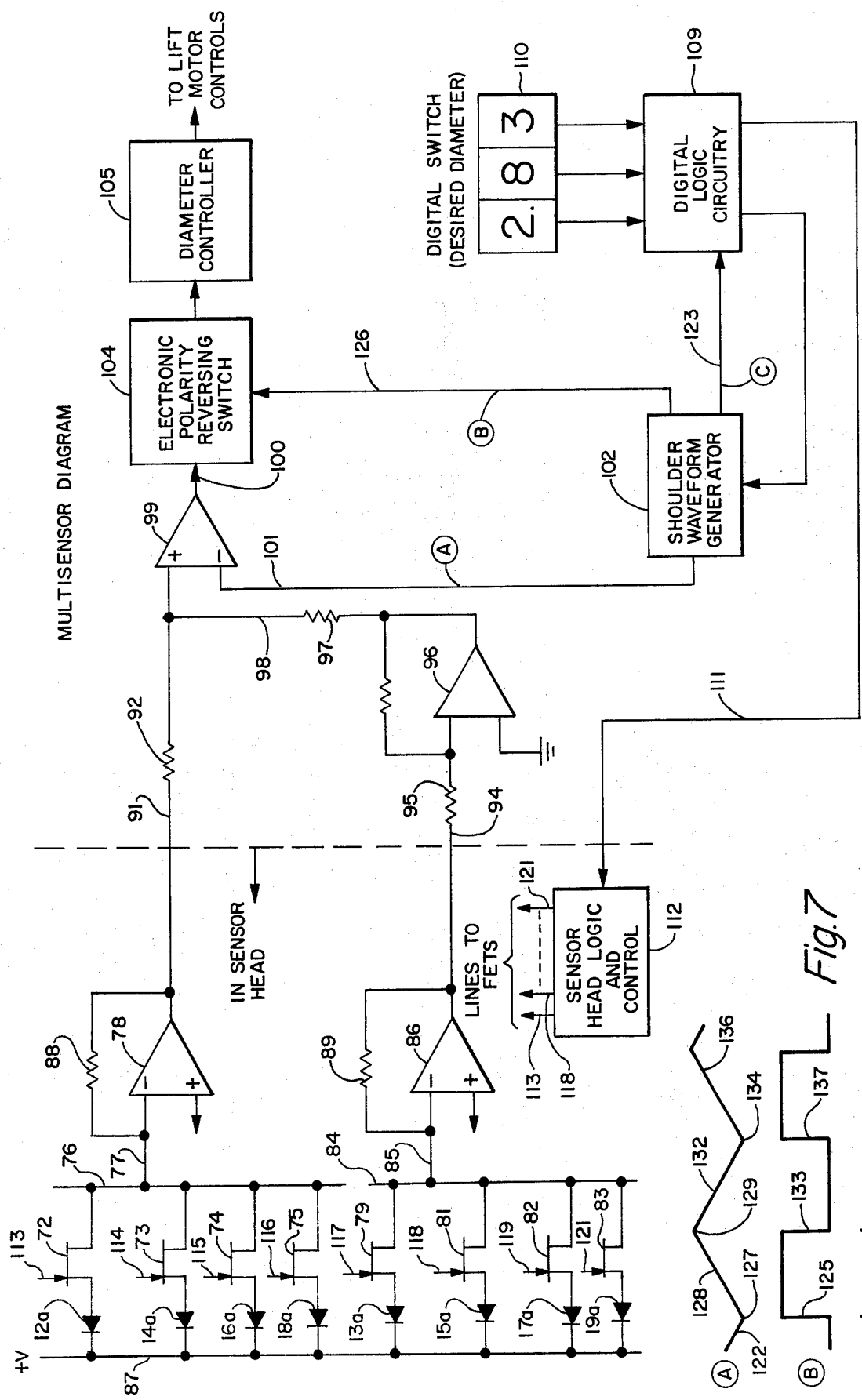
FIG. 6 is a circuit and block diagram illustrating the operation of the invention.
FIG. 7 is a series of three curves useful in explaining the operation of the invention.

Referring to FIGS. 6 and 7 there are shown a circuit diagram and graphs, respectively, illustrating diagrammatically additional structure and the functioning of the apparatus, according to the invention. It will be observed that the even numbered photocells 12a, 14a, 16a, 18a etc., are connected in one group and the odd numbered photo-cells 13a, 15a, 17a and 19a are connected together in a second group. The even numbered photocells 12a–18a are connected respectively through normally non-conducting field effect transistors (FETS) 72, 73, 74 and 75, respectively, to conductor 76 and through conductor 77 to one terminal of amplifier 78. Correspondingly, the odd numbered photocells 13a–19a are connected respectively through normally non-conducting field effect transistors (FETS) 79, 81, 82 and 83, respectively, to conductor 84 and through conductor 85 to one terminal of amplifier 86. One terminal of all the photocells, whether odd or even, are connected together to a conductor 87 going to a source of plus voltage for example 12 volts in one typical system. The amplifiers 78 and 86 may be of any well known form suitable for the purpose and as shown according to one form have the inputs from the doides connected to their negative terminals, the positive terminals being connected to the source of positive voltage. Each of the amplifiers include feed back resistors 88 and 89 as is well understood.

The output of amplifier 78 (even numbered diodes) is conducted through conductor 91 and resistor 92 to a terminal 93. The output of amplifier 86 (odd numbered diodes) is conducted through conductor 94 and resistor 95 to an inverting amplifier 96 of well known form and through resistor 97 and conductor 98 to terminal 93. Since the voltage from amplifier 86 was inverted by amplifier 96, the voltage at terminal 93 represents the difference between the voltages produced by the even numbered photocells and the odd numbered photocells. Thus the voltage at terminal 93 is the error voltage plotted as the outputs shown in FIG. 8. The voltage at terminal 93 is supplied to the positive terminal of which an offset voltage A may be supplied over conductor 101 from the shoulder wave from generator 102.

When the voltage at terminal 93 is zero that is to say when the voltages developed by the particular even and odd numbered photocells in circuit at the time are equal and there is no offset voltage A applied to amplifier 99 over conductor 101 the circuit will result in maintaining the diameter of the crystal at whatever value corresponds to the zero crossing voltage of the particular odd and even photocells. For example, if the photocells 12a and 15a were connected in circuit via appropriate energization of the FETS 72 and 81 the crystal diameter would be controlled at point 103 of graph 67 (FIG. 8). Under these conditions no signal would be supplied through electronic polarity reversing switch 104, the automatic diameter controller 105, the lift motor control 56 (FIGS. 1 & 3) and the seed pull motor 28 would thus remain running at whatever speed was required to maintain the crystal diameter at 1.10 inches corresponding to point 103 (FIG. 8). If, however, the crystal diameter should begin to increase the error voltage as shown by graph 67 would increase slightly (terminal 93) and the amplifier 99 would develop a voltage which would pass through the circuit components 104, 105 and 56 resulting in an increase in the speed of seed pull motor 28 with concomitant decrease in crystal diameter and a reduction of the error voltage to zero. Correspondingly, if the crystal diameter should decrease resulting in a slight decrease in the error voltage, the reverse procedure would take place. That is the decrease in error voltage would result in a decrease ultimately in the speed of the seed pull motor with a consequent increase in crystal diameter. Similar effects would take place if the crystal diameter were being controlled at a diameter of 1.20 inches (FIG. 8), the control error voltage coming from photocells 13a and 16a (graph 68) the control being about point 106 of graph 69, and diameter control of 1.40 inches would take place about point 108 of the graph 71 of photocells 15a and 18a.

The desired changes in diameter of a crystal while it is being grown to develop the neckin portion 29 and the shoulder 31 are developed by appropriate offset voltages A through the shoulder wave form generator 102, the digital logic circuitry 109 and the digital switch 110.

For an explanation of the remaining apparatus according to the invention, it will be assumed that a crystal is being pulled from a melt and that the operator has set the digital switch to some desired diameter for example 2.83 inches. The digital logic circuitry 109 receives the information as to the final diameter and already contains within it the desired information to give the dimensions of the neckin portion 29 and shoulder 31. The digital logic circuitry 109 supplies an appropriate signal over conductor 111 to the sensor head logic control circuitry 112 which supplies turn on voltages over conductors 113, 114, 115, 116, 117, 118, 119, 121 etc., of the FETS 72, 73, 74, 75, 79, 81, 82, and 83 respectively. The sensor head logic and control circuit 112, of course, has sufficient lines to supply turn on and turn off signals to all of the photocells in addition to the ones immediately referred to.

It will be further assumed that at the particular instant the crystal diameter is being controlled at 1.10 inches (point 103 of graph 67). The sensor head logic and control circuit 112 under the influence of the digital logic circuitry 109 has turned on FETS 72 and 81 by voltages over conductors 113 and 118. The output voltages from photocells 12a and 15a add to zero error voltage at terminal 93. At this point the offset voltage A is introduced into the amplifier 99 from shoulder wave form generator 102 over conductor 101. The offset voltage A at this point has a negative going portion 122 (FIG. 7). The voltage at the output of amplifier 99, conductor 100, goes negative, destroying the balance in the motor control circuitry, and causes the seed pull motor to run slower, thereby increasing the crystal diameter. This in turn causes the error voltage developed by diodes 12a and 15a to increase positively to bring the error voltage at terminal 93 to a value equalling that of offset 122 so as to bring the voltage at conductor 100 back to zero. This continues until the crystal diameter has increased to 1.15 inches. Here, under the present crystal growth program, the shoulder wave form generator 102 sends a pulse C (FIG. 7) over conductor 123 to the digital logic circuitry 109. This in turn sends a signal over conductor 111 to the sensor head logic and control circuitry 112 causing it to select the next pair of diodes 13a and 16a by sending a turn on signal over conductors 117 and 115 while at the same time sending a turn off signal to FETS 72 and 81 over conductors 113 and 118.

The polarity of the error signal developed at terminal 93 in the case of diodes 13a and 16a is reversed with respect to the polarity of the error voltage at terminal 93 for the case of diodes 12a and 15a. Thus, during the course of crystal shoulder growth, the sign of the error signal with respect to the crystal diameter error alternates depending upon whether the lower numbered photo-diode element is numbered odd or even. Hence from control loop considerations, an electrical polarity reversing switch is needed and is represented in the circuit of FIG. 6 by the reference character 104.

At the time that the shoulder wave form generator 102 sends a signal pulse 124 to change photo-diodes from 12a and 15a to 13a and 16a, a signal pulse 125 (curve B of FIG. 7) is sent over conductor 126 to the reversing switch 104.

When the pair of diodes 13a and 16a has been selected and is connected into the circuit, the immediate indication at terminal 93 (input to amplifier 9) is that the crystal is undersized by 0.05 inches. However the voltage wave 122 at the point 127 applied over conductor 101 to amplifier 99 just cancels this error voltage. The triangular, or saw tooth, voltage wave, that is, the offset voltage over conductor 101 moves toward the zero axis and beyond along the graph leg 128 and the crystal must therefore keep increasing in diameter in order for the error voltage input to amplifier 99 to remain nulled. It is noted that the error voltage curve 68 for the photo-diodes 13a and 16a is just like the error voltage curve for diodes 12a and 15a (67) except that it is displaced along the diameter axis by one-tenth of an inch and is inverted. The slowly varying voltage wave 128 continues applying an offset voltage to input 101 of amplifier 99 until the crystal reaches a diameter of 1.25 inches.

At this point, another pulse 129 is emitted from the shoulder wave form generator 102 to the digital logic circuitry 109 which tells the sensor head logic and control circuit 112 to turn off diodes 13a and 16a and to turn on diodes 14a and 17a. The later is accomplished by turning on FETS 73 and 82 by appropriate signals over conductors 114 and 119. Also at this point, the offset voltage generated by the shoulder wave form generator 102 is that shown by the triangular wave leg 132 beginning at point 129. Also the shoulder wave form generator 102 generates the negative going signal 133 which passes over conductor 126 to establish the correct polarity of the signal going to the lift motor control. Under the influence of the offset voltage 132 the crystal keeps increasing in diameter for the error voltage at terminal 93 to have the proper magnitude at its input to the amplifier 99 in order to keep the total input to this amplifier nulled. It is noted that the error curve for photo-diodes 14a and 17a (69) is just like the preceding error graphs 67 and 68 except that it is displaced along the diameter axis by an additional one-tenth of an inch and is inverted with respect to the error graph 68.

The continued application of the offset voltage 132 causes the diameter of the crystal to increase to 1.35 inches at point 134 on the error voltage graph. At this point a pulse 135 is emitted from the shoulder wave form generator 102 and passes to the digital logic circuitry 109 which in turn commands the sensor head logic and control circuit 112 to turn off the FETS 73 and 82 to disconnect, so to speak, the photo-diodes 14a and 17a. At the same time it causes the sensor head logic and control circuitry 112 to send a turn on signal to the FETS 81 and 75 to connect photo-diodes 15a and 18a into the circuit. The offset voltage becomes positive going as shown by the graph portion 136 and the crystal diameter continues to increase under this influence until it reaches a diameter of 1.45 inches. The shoulder wave form generator 102 at the point 134 of the offset voltage curve sends a signal 137 to the polarity reversing switch 104 for purposes already described. The crystal growth under the influence of photo-diodes 15a and 18a is shown by the graph 71 for that portion thereof extending the crystal diameter of 1.35 to 1.45 inches.

The procedure described for the pairs of photo-diodes 12a–15a, 13a–17a, and 15a–18a continues until the counter in the digital circuitry contains the number of corresponding to the present diameter of 2.83 inches, for example, or any other. At this point the shoulder wave form generator 102 is shut off and whatever pair of photo-diode elements corresponding to the desired crystal diameter is now used for the remainder of the crystal growth at the constant diameter. The conical shoulder at this point is rounded over and the crystal continues to grow cylindrically from this point on.

As has been described, the FETS including 72–83 are driven from the digital logic circuits and only one odd photodiode element and one even photo-diode element are on at any one time. Thus pairs of photo sensor diodes are used to cover each 0.1 inches of diameter. Within each of these increments electrically offsetting of the control point is used to achieve a diameter setting capability accurate to 0.01 inches. After the crystal is drawn at its final diameter and is described the end portion 32, or final taper is formed in the same manner.

The circuit components shown to the left of the dotted line 138 in FIG. 6 may conveniently be disposed in multi-cell photo detector unit 48 shown in FIGS. 1 and 3. The crystal growth programmer 139 of FIG. 3 comprises the circuit components 102, 109 and 110 of FIG. 6 and other adjustments needed for neck diameter, neck length, shoulder angle and final diameter as shown in FIG. 3.

What is claimed is:

1. In a system for automatically growing a crystal of controlled diameter from a seed, through neckin, shoulder, body and final taper from a melt of material including a container for said melt, motor means for pulling a crystal from said melt, means for controlling said motor means, and means responsive to radiation emanating from the liquid-solid interface of said crystal including the halo as said crystal as being pulled for controlling said motor control means comprising, photo-sensitive means positioned to receive radiation from said liquid-solid interface throughout the total region from seed to final taper;

said photo-sensitive means comprising a series of successively disposed photocells each one of which is arranged to receive radiant energy from a specific area of said liquid-solid interface including said halo as said crystal is being pulled from seed to final taper, each photocell of said series being differentially connected to a second photocell spaced by at least one intervening photocell and defining a pair of photocells defining a linear error signal region for developing an error signal whose magnitude varies linearly with changes in crystal diameter over a specific range of crystal diameter and having a null value at a particular value of crystal diameter, the signal from each successive pair of said photocells having a null value at a particular value of crystal diameter greater than the preceding crystal diameter by the same predetermined amount, the linear error signal region of each pair of said photocells extending to the linear error signal region of the next succeeding apir of photocells, programmed means for automatically selecting in sequence the successive pairs of said photocells throughout the cycle of crystal growth from seed to final taper;

means for developing a crystal diameter related offset signal, and means for combining said offset signal and error signal and supplying same to said motor control means for controlling said motor to pull said crystal to a predetermined diameter.

2. The system according to claim 1 wherein said differentially connected photocells are spaced by two intervening photocells.

3. The system according to claim 1 wherein said programmed means includes FETS for turning on and off said photocells.

4. The system according to claim 1 wherein said offset signal developing means develops a saw tooth voltage signal successive portions of which correspond to successive increments of crystal diameter changes.

5. The system according to claim 4 including polarity changing means for changing the polarity of the signal from said means combining said offset and error signals.

* * * * *